(12) United States Patent
Pritchard et al.

(10) Patent No.: US 10,461,753 B1
(45) Date of Patent: Oct. 29, 2019

(54) PULSE-BASED SYNCHRONIZATION TRAINING FOR SYNCHRONOUS DIGITAL AND MIXED-SIGNAL SYSTEMS

(71) Applicant: SEAKR Engineering, Inc., Centennial, CO (US)

(72) Inventors: Jeff Pritchard, Aurora, CO (US); Jeff Highley, Parker, CO (US); James Randolph, III, Highlands Ranch, CO (US)

(73) Assignee: SEAKR ENGINEERING, INC., Centennial, CO (US)

( * ) Notice: Subject to any disclaimer, the term of this patent is extended or adjusted under 35 U.S.C. 154(b) by 0 days.

(21) Appl. No.: 15/978,017

(22) Filed: May 11, 2018

Related U.S. Application Data

(60) Provisional application No. 62/505,287, filed on May 12, 2017.

(51) Int. Cl.
*H03L 7/00* (2006.01)

(52) U.S. Cl.
CPC ..................... *H03L 7/00* (2013.01)

(58) Field of Classification Search
CPC .. G06F 1/12; G11C 7/22; G11C 7/222; H04L 7/033
See application file for complete search history.

(56) References Cited

U.S. PATENT DOCUMENTS

2005/0201421 A1* 9/2005 Bhandari .............. H04J 3/0682
370/519

* cited by examiner

*Primary Examiner* — Sibin Chen
(74) *Attorney, Agent, or Firm* — Perkins Coie LLP

(57) ABSTRACT

Systems and methods for synchronizing the clocks of a central device and one or more destination devices are disclosed. In some embodiments the central device and destination devices are implemented in a space-based or high-altitude asset. The central device provides a series of synchronization pulses to the one or more destination devices. In response to detecting, at the destination device, the synchronization pulse, a sample of the destination device clock is stored in a register. The sample is provided to the central device. The sequence is repeated at least once. A phase offset between the central device clock and the destination device clock may be determined based on the returned samples and the position of the samples within the register.

1 Claim, 6 Drawing Sheets

Figure 1:
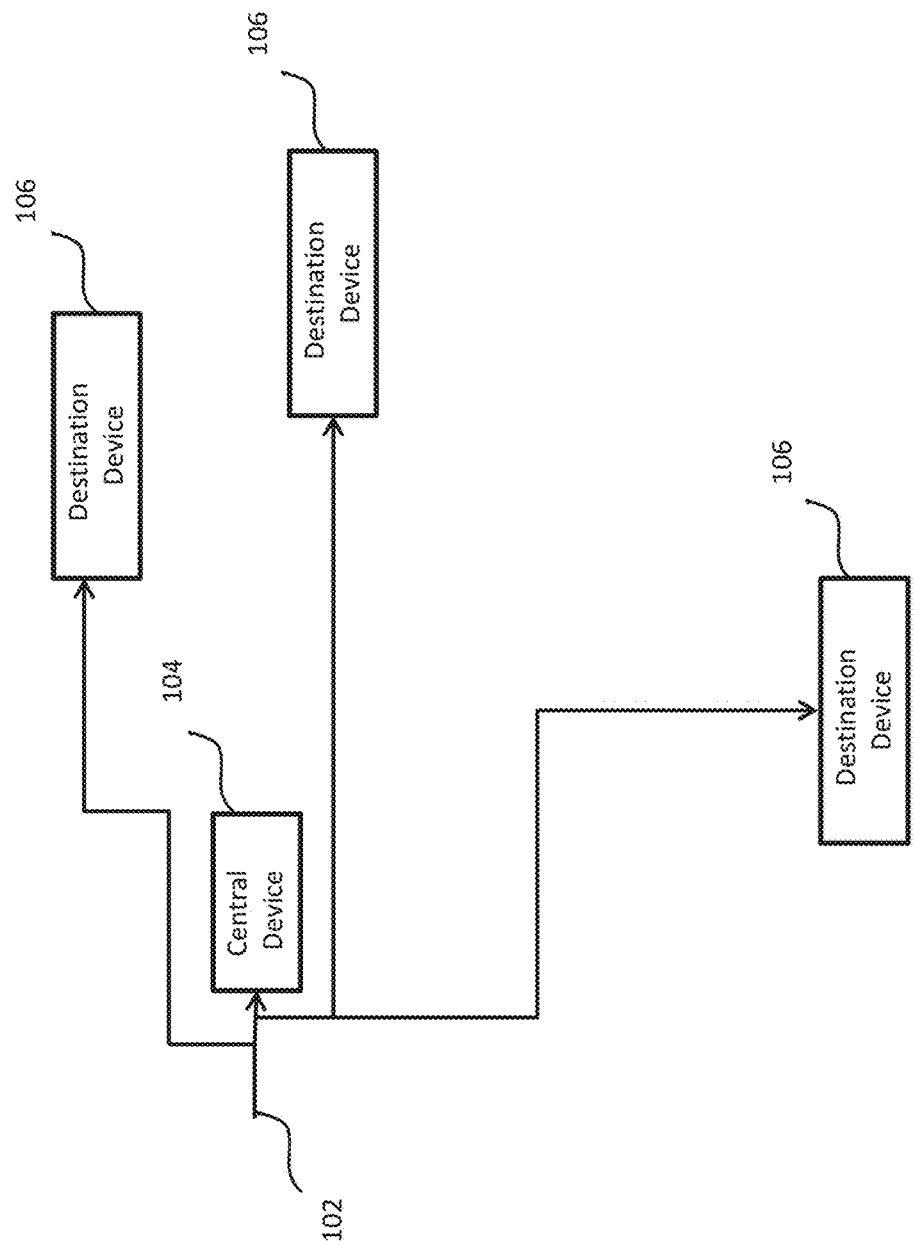

PULSE-BASED SYNCHRONIZATION TRAINING FOR SYNCHRONOUS DIGITAL AND MIXED-SIGNAL SYSTEMS

CROSS-REFERENCE TO RELATED APPLICATIONS

The present application is a non-provisional of U.S. Provisional Patent Application Ser. No. 62/505,287, titled "PULSE-BASED SYNCHRONIZATION TRAINING FOR SYNCHRONOUS DIGITAL SYSTEMS", filed May 12, 2017, which is incorporated herein as if set out in full.

BACKGROUND

Digital systems may include more than one processing device distributed within a system such that processing devices have varying electrical path lengths from a central or master device for coordinating or controlling the operation of the system. As digital systems are operated at higher and higher speeds, the synchronization of clocks becomes ever more important to the proper operation of the system as a whole. However, due to the varying electrical path lengths signals must travel between a central device and other processing devices in the system, variation in synchronization between processors can lead to improper functionality of the digital system.

Accordingly, systems and methods for achieving and maintaining clock synchronization in high-speed synchronous digital and mixed-signal systems are desirable.

SUMMARY

This Summary is provided to introduce a selection of concepts in a simplified form that are further described below in the Detailed Description. This Summary, and the foregoing Background, is not intended to identify key aspects or essential aspects of the claimed subject matter. Moreover, this Summary is not intended for use as an aid in determining the scope of the claimed subject matter.

In some examples, a system for synchronizing digital devices comprises: a central device comprising: a first input port configured to receive a reference clock signal; a synchronization pulse generator configured to receive a central device clock and generate a synchronization pulse signal, wherein the central device clock is the reference clock signal as received at the central device; control circuitry configured to obtain a delay amount; phase select circuitry configured to receive the delay amount from the control circuitry; variable delay circuitry configured to receive the delay amount from the phase select circuitry and delay the synchronization pulse signal by the delay amount; determine a phase offset between a central device clock and a destination device clock based on at least two sample values of the destination device clock; and a destination device comprising: a second input port configured to receive the reference clock signal; clock sampler circuitry configured to: receive the synchronization pulse signal and the destination device clock, wherein the destination device clock is the reference clock signal as received at the destination device; detect an edge of a pulse in the synchronization pulse signal; in response to detecting the edge of the pulse, obtain a sample of the destination device clock; provide the sample of the destination device clock to the central device.

In some examples, a system for synchronizing digital devices comprises: a central device comprising: a first input port configured to receive a reference clock signal; a synchronization pulse generator configured to receive a central device clock and generate a synchronization pulse signal, wherein the central device clock is the reference clock signal as received at the central device; control circuitry configured to obtain a delay amount; phase select circuitry configured to receive the delay amount from the control circuitry; variable delay circuitry configured to receive the delay amount from the phase select circuitry and delay the synchronization pulse signal by the delay amount; determine a phase offset between a central device clock and a destination device clock based on at least two sample values of the destination device clock; and a destination device comprising: a second input port configured to receive the reference clock signal; clock sampler circuitry configured to: receive the synchronization pulse signal and the destination device clock, wherein the destination device clock is the reference clock signal as received at the destination device; detect an edge of a pulse in the synchronization pulse signal; in response to detecting the edge of the pulse, obtain a sample of the destination device clock; provide the sample of the destination device clock to the central device.

These and other aspects of the present system and method will be apparent after consideration of the Detailed Description and Figures herein. It is to be understood, however, that the scope of the invention shall be determined by the claims as issued and not by whether given subject matter addresses any or all issues noted in the Background or includes any features or aspects recited in this Summary.

DRAWINGS

Non-limiting and non-exhaustive embodiments of the present invention, including the preferred embodiment, are described with reference to the following figures, wherein like reference numerals refer to like parts throughout the various views unless otherwise specified.

Figure 2:
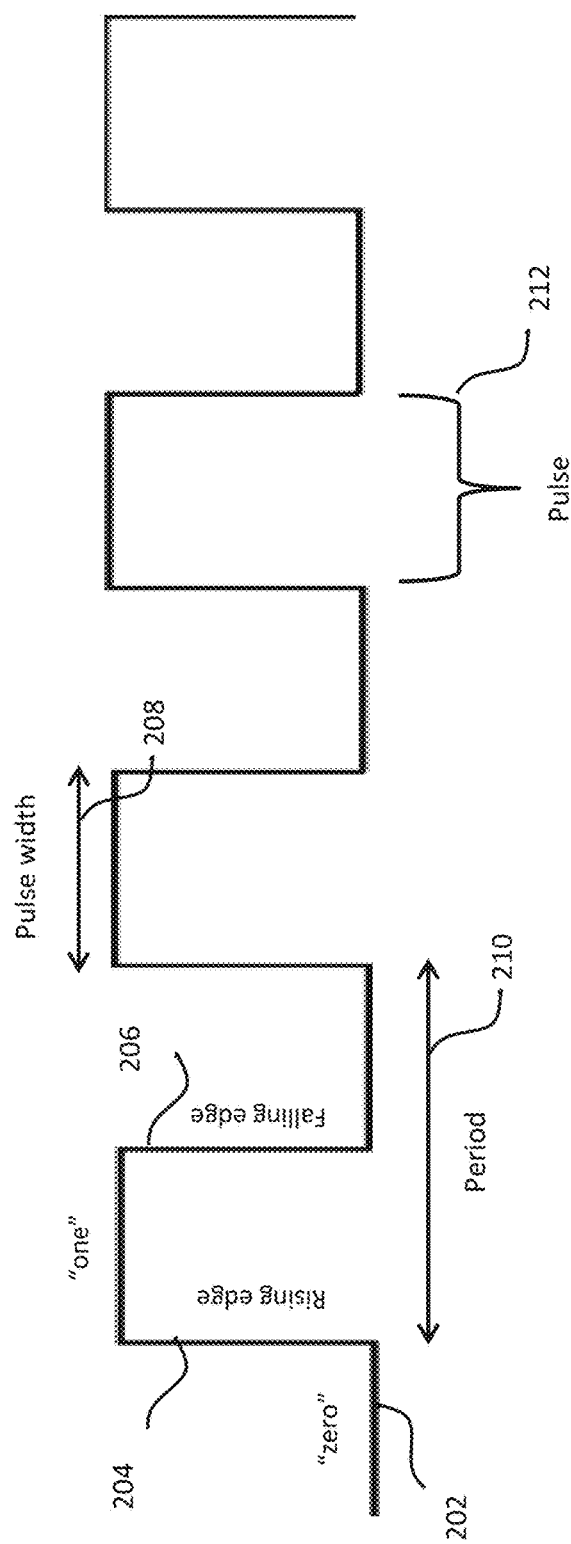
Figure 3:
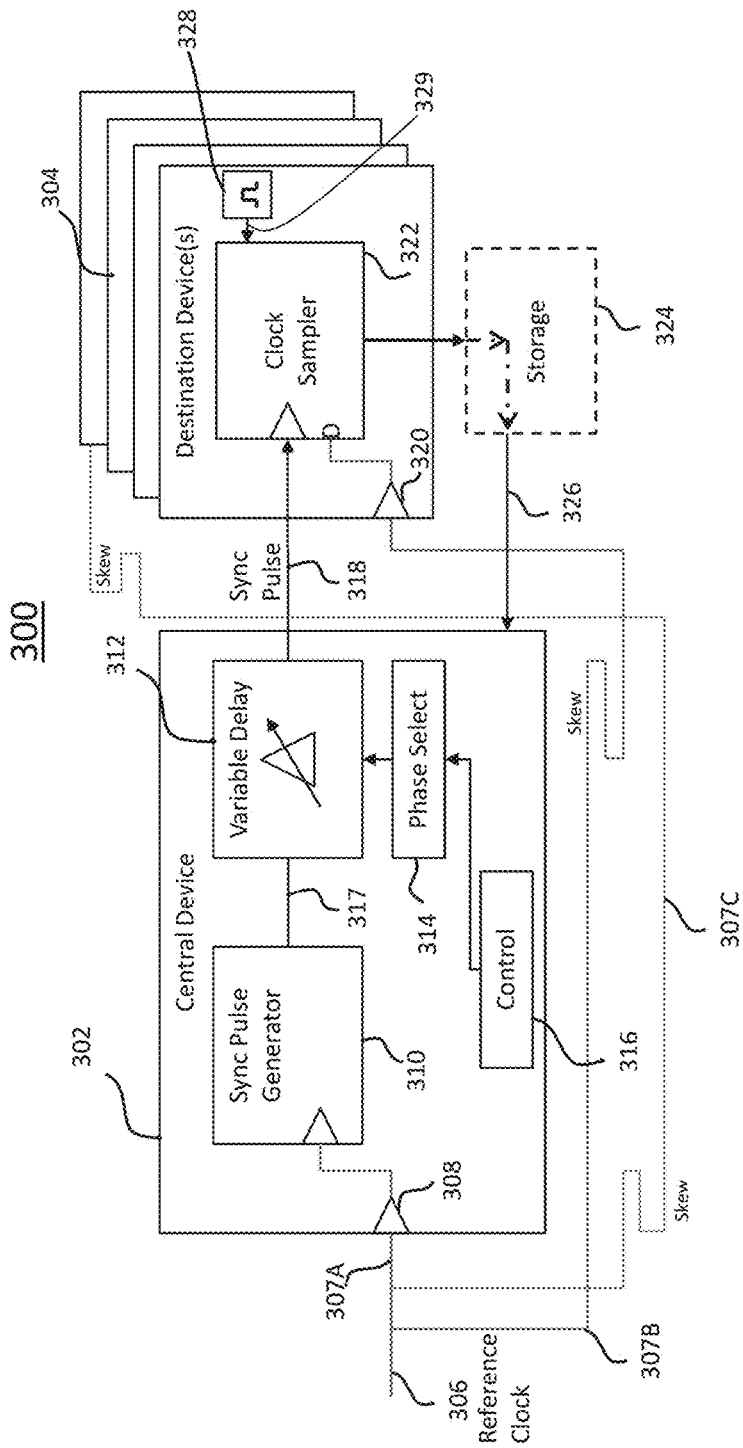
Figure 4A:
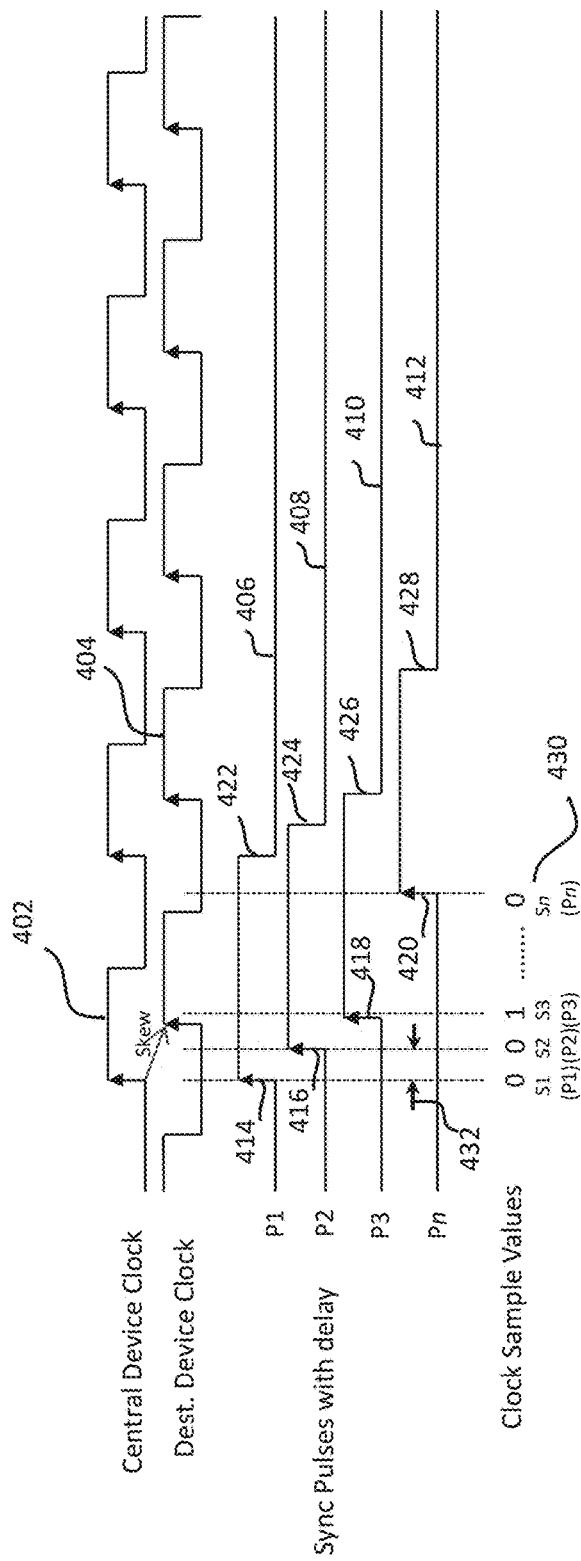
Figure 4B:
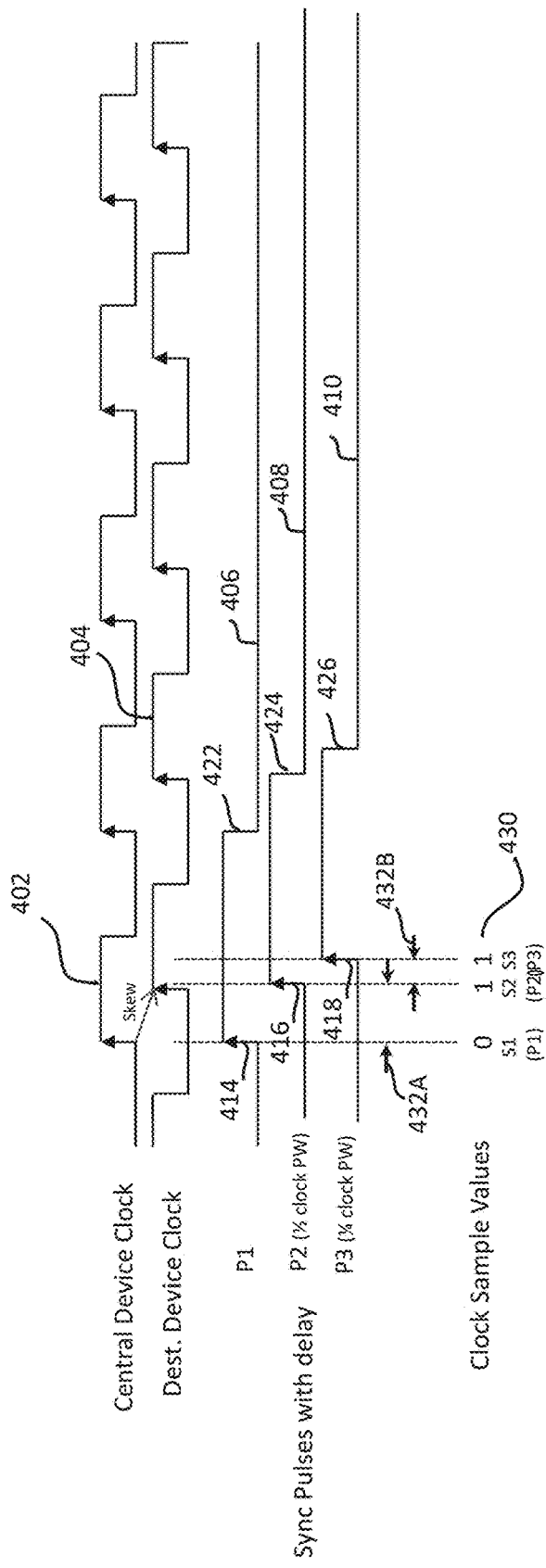
Figure 5:
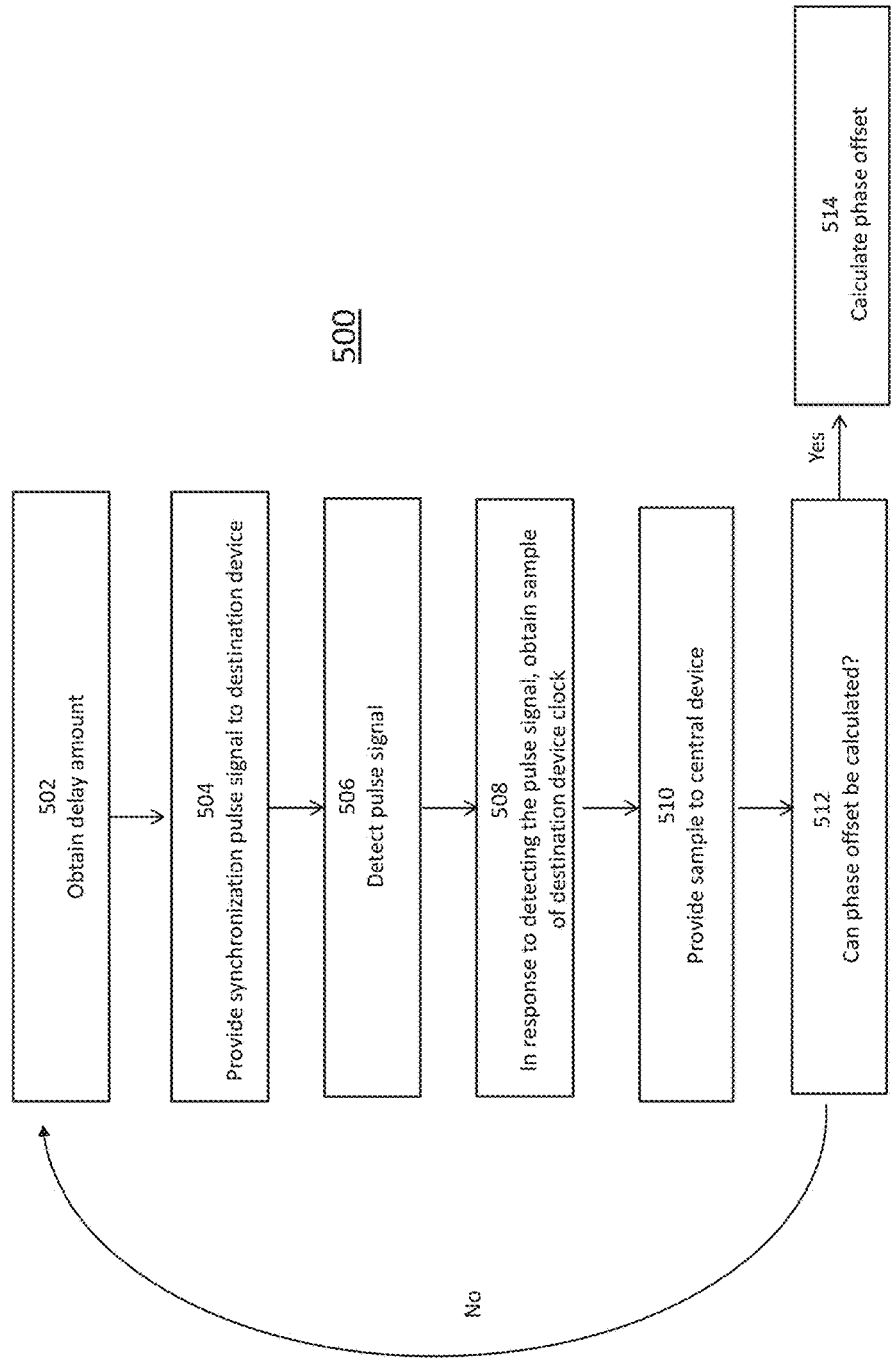

FIG. 1 depicts an exemplary digital system.
FIG. 2 depicts an exemplary digital signal.
FIG. 3 depicts an exemplary digital system.
FIGS. 4A and 4B depict exemplary signals in a digital system.
FIG. 5 depicts an exemplary method for determining a phase offset between clocks in a digital system.

DETAILED DESCRIPTION

Embodiments are described more fully below with reference to the accompanying figures, which form a part hereof and show, by way of illustration, specific exemplary embodiments. These embodiments are disclosed in sufficient detail to enable those skilled in the art to practice the invention. However, embodiments may be implemented in many different forms and should not be construed as being limited to the embodiments set forth herein. The following detailed description is, therefore, not to be taken in a limiting sense.

In light of the above-referenced shortcomings of existing digital systems, the current disclosure describes a pulse-based method for synchronizing chips in large-scale digital or mixed-signal systems. In general, synchronous digital systems require timing synchronization among processing devices (e.g., microprocessors, chips, field programmable gate arrays (FPGA), application specific integrated circuits (ASIC), multi-chip modules (MCM), systems on a chip (SoC), systems in a package (SiP), and the like) to compensate for differences in electrical timing characteristics due to different electrical or signal path lengths, process variations, thermal effects, and supply voltage (PVT). Accurate clock synchronization is particularly important and challenging in high-speed synchronous digital and mixed-signal systems. In communications systems, such as satellite-based and high-altitude communications systems, it is necessary for plural processing devices operate in synchrony to ensure that radio-frequency (RF) inputs and RF outputs are appropriately processed by digital and mixed-signal processing devices. For example, signal processing by analog-to-digital converters (ADCs) and digital-to-analog converters (DACs) distributed among multiple diverse processing devices, separated by varying path lengths and exposed to varying temperature and radiation environments, must be synchronized in order to properly process RF inputs to and RF outputs from the system. In some examples, this may have particular significance for systems including a direct radiating array (DRA) or phased array and for which accurate timing and beamforming is important.

The present disclosure is directed to a large-scale or ultra large-scale digital or mixed-signal system implemented in space-based or high-altitude assets such as, for example, communications satellites, high-altitude communications and weather balloons, unmanned aerial vehicles (UAVs), drones, commercial, military, and private aircraft, and the like. Radiation from cosmic rays and solar wind may impact such space-based and high-altitude assets with a much higher energy, cross-section, and rate of incidence than ground-based or terrestrial assets. Accordingly, the present disclosure is directed to digital or mixed-signal systems which also include radiation mitigation structures, designs, and techniques which correct for, compensate for, or prevent radiation-induced effects such as Single Event Effects (SEEs), as will be discussed in more detail below. Such SEEs may cause the space-based and high-altitude asset to operate inefficiently, become temporarily inoperable, or require a partial or complete shutdown of a portion of the device. As a result, synchronization of the various digital or mixed-signal chips within the asset may be disrupted, requiring a re-synchronization to ensure proper operation of the space-based or high-altitude asset.

Synchronous digital or mixed-signal systems typically rely on clock signals (sometimes called timing signals or strobes) to synchronize the operation of multiple digital or mixed-signal chips. In some examples, each digital or mixed-signal chip may include multi-chip modules (MCM), single or multiple dies in a single package, one or more field programmable arrays (FPGAs), one or more Application Specific Integrated Circuits (ASICs), Systems on a Chip (SOCs), Systems in a Package (SiP), and the like. In some examples, one or more digital or mixed-signal chips may be provided on or electrically coupled to a card or a board (such as printed circuit boards, printed wiring boards, and the like), which may interface with other cards or boards containing one or more digital or mixed-signal chips. Each digital or mixed-signal chip may have its own clock which must be synchronized to a reference clock signal to ensure that the overall system functions correctly. Some high-speed systems require tightly synchronized clocks among multiple devices. However, differences in electrical path or signal lengths between devices cause the introduction of clock skew between the devices, wherein different devices receive a master clock signal at different times and thus are not fully synchronized. Similarly, temperature variations can dynamically alter the effective path length to each device and cause variable clock skew. Additionally, radiation effects such as SEEs, discussed in more detail below, may disrupt all or a portion of the digital or mixed-signal system or digital or mixed-signal chip to cause asynchronous operation relative to other devices within the digital or mixed-signal system which are not impacted by said radiation.

As depicted in FIG. 1, in some examples a reference clock signal 102 may be provided to a central device 104 and to one or more destination devices 106 via communications lines in order to ensure synchronous operation among the devices. In some examples, communications lines may include serial communications lines (e.g., SerDes), differential signaling lines (e.g., low-voltage differential signaling (LVDS), low-voltage positive-referenced emitter coupled logic (LVPECL), current mode logic (CML)), and the like. However, due to differences in path lengths between each destination device 106 and the central device 104, the reference clock signal may arrive at each destination device 106 at a slightly different time and as a result may be out of phase or phase-shifted relative to the reference clock signal 102 received at the central device 104. That is, the varying path lengths between central device 104 and destination device(s) 106 may result in the phase of the reference clock signal received at the destination device(s) 106 being shifted in time or out-of-phase with respect to the reference clock signal received at other destination device(s) 106 and/or with respect to the phase of the reference clock signal received at the central device 104. Furthermore, the phase offset of the reference clock signal at various devices 104, 106 may not be a constant value and the phase offset may change over time due to changing temperature conditions, supply voltage, radiation effects on all or a portion of the central and/or destination devices, radiation effects on all or a portion of a signal path include one or more serial or parallel communications lines between chips or within a chip, or other variable conditions that affect circuit timing characteristics. It is noted that in some examples of the present disclosure, the central device may also be referred to as a master device or primary device, and the destination device(s) may also be referred to as slave or secondary devices.

In some examples, it may be desirable for central device 104 to be able to determine the phase offset of the reference clock 102 received at the central device 104 and the reference clock 102 received at one or more of the destination devices 106. For clarity, the reference clock signal 102 as received at the central device 104 may be referred to as the central device clock, while the reference clock signal 102 as received at the destination device 106 may be referred to as the destination device clock.

As will be described in more detail with respect to FIGS. 3-4, in some examples, central device 104 can determine a phase offset between its own clock (e.g., the central device clock) and the clock at a destination device 106 (e.g., the destination device clock) by sending a series of variably delayed synchronization pulses to destination device 106, in response to which destination device 106 samples its own clock and returns sample values to the central device 104. Central device 104 may then use these sample values to determine the phase offset between its own clock (e.g., the central device clock) and the clock of destination device 106 (e.g., destination device clock), and/or (in some examples) between the clocks of two different destination devices 106.

As depicted in FIG. 2, a digital signal 202 such as a clock signal or pulse signal may vary discretely between two values that may be called a "zero" and a "one" (e.g., a logical 1 value and a logical 0 value). The transition from a zero value to a one value may be called a rising edge 204, while the transition from a one value to a zero value may be called a falling edge 206. The signal depicted in FIG. 2 is a periodic digital signal with the period 210 as shown. The pulse width 208 of a pulse 212 is the duration between a rising edge and a falling edge of the pulse 212. Alternatively, the pulse width 208 of a pulse 212 may be referred to as the duration of a logical "one" value in a given period 210.

A periodic clock signal typically has a duty cycle of approximately 50%, while a periodic pulse signal typically has a duty cycle of less than 50% and may visually appear as a series of relatively short pulses. The shorter duty cycle of a periodic pulse signal allows for a higher-fidelity or higher-resolution sampling of the destination clock signals, as will be discussed below. However, these distinctions are not required and in some examples, a clock signal may have a duty cycle that is greater than or less than 50%, and a periodic pulse signal may have a duty cycle of 50% or greater. In some examples, a pulse signal may not be periodic; for example, a pulse signal may consist of a single pulse, or of multiple pulses with variable separation.

Training Mode

In some examples, central device 104 and destination device(s) 106 can operate in a training mode to determine an initial phase offset(s) between the central device clock and the destination device(s) clock. The training mode may be initiated at system initialization, at power up, in response to receiving an indication of an error (including errors induced by radiation effects), based upon the phase offset(s) being greater than a predetermined amount (e.g., a phase offset threshold), and/or in response to a command (e.g., after a predetermined time has elapsed or in response to a command from an space-based or high-altitude asset operator), for example.

FIG. 3 depicts an exemplary digital or mixed-signal system 300 that includes central device 302 and one or more destination devices 304. In this example, central device 302 and destination device(s) 304 are configured to receive, on input ports 308, 320, reference clock signal 306. As discussed above, the reference clock signal 306 received at the central device 302 may be referred to as the "central device clock" and the reference clock signal 306 received at the one or more destination devices 304 may be referred to as the "destination device clock." As illustrated in FIG. 3, destination clock signal 307B, 307C as received at destination device port 320 of destination device(s) 304 may be phase-offset (i.e., skewed) from central device clock signal 307A as received at central device port 308. This skew may results from several factors including differences in the physical wiring or signal path distance between the two devices 302, 304, different effective wiring or signal path differences resulting from different temperature effects, and/or radiation effects on the central device 302, destination device(s) 304, or signal communication lines carrying central and destination device clocks 307A-C. For example and without limitation, temperature effects may include variation in resistivity of the wires based on temperature differences or changes, the effect on the operation of active devices in the clock distribution network as a result of temperature changes or differences, and the like. Thus, the central device clock 307A (e.g., the reference clock signal received at the central device) may be phase offset from the destination device clocks 307B, 307C (e.g., the reference clock signal received at the destination devices 304). It is noted that although two destination device clocks 307B, 307C are discussed, more or fewer destination device clocks may be provided in the digital or mixed-signal system 300 corresponding to the number of destination devices 304.

In some examples, central device 302 includes synchronization pulse generator circuitry 310 that is configured to generate a synchronization pulse signal 317. As will be described below, the synchronization pulse signal 318 (which is the synchronization pulse signal 317 after being adjusted by variable delay circuitry 312) may be used to adjust the sampling frequency of destination device clocks of the destination device(s) 304 (i.e., the reference clock signals received at destination devices 304). Accordingly, the synchronization pulse signal 318 may also be referred to as a sampling pulse signal 318. In some examples, central device 302 includes variable delay circuitry 312 that can be configured to advance or retard synchronization pulse signal 317 and thereby selectively adjust the phase offset (e.g., delay amount) of synchronization pulse signal 318 relative to, for example, the central device clock 307A or a previous synchronization pulse signal 318. In some examples, central device 302 includes phase selection circuitry 314 that receives control data from controller circuitry 316 and is configured to control the delay amount produced by variable delay circuitry 312 based on the received control data (which may be, for example, control data in response to an outside control signal from a system operator, in response to samples received from status connection 326, or may be controlled based on a predetermined algorithm stored on a storage device in the central device 302).

In some examples, central device 302 provides, to destination device(s) 304, a series of synchronization pulse signals 318, where each synchronization pulse signal is delayed by a delay amount relative to the central device clock or a previous synchronization pulse signal 318. For example, central device 302 may provide one or more synchronization pulses P1, P2, P3 . . . Pn which are offset by variable delay circuitry 312 to produce varying delay amounts with respect to each other, as will be discussed below with respect to FIGS. 4A and 4B. Synchronization pulse signal 318 may include one or more pulses, each of which is defined by a rising edge and falling edge as depicted in FIG. 2. In some examples, the delay amount may be the amount of time between an edge (e.g., a rising or falling edge) of the central clock signal and a corresponding edge (e.g., a rising or falling edge) of a pulse of the synchronization pulse signal. In some examples, the delay amount may be the amount of time between an edge of a first synchronization pulse signal and an edge of a second synchronization pulse signal.

In some examples, destination device 304 includes clock sampler circuitry 322. Clock sampler circuitry 322 may be configured to receive synchronization pulse signal 318 from central device 302 and detect an edge of a pulse of synchronization pulse signal 318 (e.g., a rising edge or falling edge). In some examples, in response to detecting the edge of the pulse, clock sampler circuitry 322 obtains a sample of the destination device clocks 307B, 307C, as depicted by the synchronization pulse signals P1, P2, P3, Pn illustrated in FIGS. 4A and 4B, for example. In some examples, the sample includes a sample value (e.g., logical zero or logical one) which may also include a timestamp value as discussed below. The samples may be provided to central device 302 to enable central device 302 to calculate or determine a phase offset between the central device clock 307A and the destination device clock(s) 307B, 307C. In some examples, the samples may be provided to central device 302 by storing them in optional storage 324, such as in one or more registers, buffers, or memory locations, from which they may be retrieved by central device 302. In some examples, samples may be provided to central device 302 directly; e.g., via status connection 326 without being saved in optional storage 324. In some examples, central device 302 can determine, based on the samples, whether an edge of destination device clock(s) 307B, 307C has been detected. That is, central device 302 may monitor the samples received from destination device(s) 304 to determine if the samples indicate a transition from a logical zero to a logical one (e.g., rising edge) or a transition from a logical one to a logical zero (e.g., falling edge). If such an edge has been detected, central device 302 may have received enough samples to calculate a phase offset between an edge of central device clock and the edge of destination device clock. If an edge has not been detected, then central device 302 may require additional samples of the destination device clock in order to calculate the phase offset.

While FIG. 3 depicts clock sampler circuitry 322 as residing within destination device 304, this is not strictly necessary. In some examples, clock sampler circuitry 322 may be circuitry that is external to destination device 304 that is; e.g., at or near port 320. In this case, clock sampler 322 must be located close enough to destination device 304 that the sample accurately reflects the clock signal at destination device 304 without introducing additional phase offset. In this case, clock sampler circuitry 322 may be configured to provide the samples to central device 302.

In some examples, samples of the destination device clock(s) may include a sample value and a timestamp value. A timestamp value may represent a time at which the sample was obtained, for example. In some examples, samples of a destination device clock may be stored in or transmitted to a register (e.g., a collection of bits), with a timestamp or "time offset" implied by the bit position of the sample value within the register. For example, based upon a position of a sample S1, S2, S3, Sn within a vector of samples, the central device 302 may be able to associate the samples with a corresponding pulse P1, P2, P3, Pn, determine from the time offset or timestamp a phase offset between P1, P2, P3, P¬n and S1, S2, S3, Sn, respectively, representing the phase offset of the central device clock 307A and one or more destination device clocks 307B, 307C. Furthermore, the central device 302 may also use these samples and associated timestamps to determine a phase offset between the one or more destination device clocks 307B, 307C. A person of skill in the art will recognize that there are many ways in which destination device 304 or clock sampler circuitry 322 could provide sampled values to central device 302, with or without associated timestamp or time offset data. For example, if a pulse P3 is phase-offset by a known delay amount and sample S3 represents a rising or falling edge of the reference device clock, then the central device 302 may determine a phase offset between the central device clock and the destination device clock(s) based on the known or predetermined delay amount applied to pulse P3 by the variable delay circuitry 312.

In some examples, the delay amount by which the synchronization pulse 318 is advanced or retarded is selected based on the pulse width of the reference clock signal (which is essentially the same as the pulse width of the destination clock signal regardless of any skew introduced), such that the series of pulses causes the clock sampler circuitry to obtain samples of the destination clock signal with sufficient fidelity to enable the central device to calculate a phase offset from the central device clock with a desired resolution.

In some examples, the central device 302 may vary the phase of the synchronization pulse (e.g., advance or retard) by a delay amount that is smaller than the pulse width of the reference clock signal in order to enable the central device to "trace" the destination device clock with sufficient fidelity. For example, if the pulse width of the reference clock to be sampled is n, the phase of the synchronization pulse may be advanced or retarded by a delay amount equal to n/3, n/4, n/5, . . . n/100 to achieve a desired resolution of the sampled clock signal.

As a non-limiting example, suppose the pulse width n of a destination device's clock signal is 2 ns (with a period of 4 ns). To achieve a desired resolution of 100 ps (0.1 ns) of the sampled destination clock signal, the central device may advance the phase offset of the synchronization pulse relative to the central device clock by another 100 ps (i.e., n/20) each time the pulse is sent out to the destination device. In this case, the delay amount is initially for pulse P1 may be 100 ps, then for P2 may be 200 ps, then for P3 may be 300 ps, etc. As previously described, the clock sampler circuitry 322 of destination device(s) 304 may respond to detecting a rising edge of a pulse in the synchronization pulse signal 318 by obtaining a sample of the destination device clock 307B, 307C and providing the sample to the central device 302. In this example, for each period of the destination device's clock signal, the destination device clock may be sampled 40 times. Ideally, this sampling rate is of sufficient resolution to detect a rising or falling edge of a destination clock signal with appropriate fidelity to ensure an accurate calculation of the phase offset between the central device clock and the destination device clock(s). As discussed above, the sampling rate may be adjusted up or down to sample a destination device clock more or less often based on a pulse width of the reference clock signal.

In some examples, the delay amount by which the synchronization pulse is advanced or retarded may be variable with a non-fixed increment. For example, a system may be configured to allow the clock sampler circuitry 322 at the destination device 302 to detect a rising edge of a synchronization pulse by advancing the synchronization pulse signal forward and backward by varying delay amounts (e.g., positive and negative delay quantities) and "homing in" on the location of the edge. In such an example, the variable delay amount may be ½ the clock period, then ¼ of the clock period, then ⅛ of the clock period, etc. until the edge is located with the precision desired. Such an approach could potentially locate a pulse edge with fewer samples relative to the previously described approach of using a constant predetermined amount of time to implement a full sweep of the synchronization pulse signal using a small fixed step size such as described in the earlier example. Such an example is illustrated in FIG. 4B wherein an edge of the destination device clock is detected by the second pulse P2. However, it is noted that further synchronization pulses may continue to be communicated to the destination device(s) 304 for a period of time with shorter delay amounts to ensure that an appropriate phase offset between the central device clock and destination device clock(s) is determined with appropriate accuracy.

FIG. 4A depicts various signals that may be generated within the above-described digital or mixed-signal system 300. Such signals may include a central device clock signal 402, a destination device clock signal 404, and a series of synchronization pulse signals 406 (pulse P1), 408 (pulse P2), 410 (pulse P3), 412 (pulse Pn) that are, in this example, each delayed by a delay amount (e.g., 432) relative to the central device clock signal 402. The synchronization pulse signals 406, 408, 410, 412 may be generated by sync pulse generator 310 and delayed by variable delay circuitry 312, for example.

In some examples, the synchronization pulse signals 406, 408, 410, 412 are received by destination device(s) 304. As depicted in FIG. 4A, in response to detecting a rising edge 414, 416, 418, 420 of the synchronization pulse signal 406, 408, 410, 412 (e.g., using clock sampler circuitry 322), the destination device(s) 304 samples (e.g., using clock sampler circuitry 322) the destination device clock 404 and returns a sample value 430 to the central device (e.g., sample S1 corresponding to pulse 406 or P1, sample S2 corresponding to pulse 408 or P2, sample S3 corresponding to pulse 410 or P3, sample Sn corresponding to pulse 412 or Pn, etc.). Thus, in response to detecting a series of pulse edges 414, 416, 418, 420, the destination device returns a series of sample values 430. The sample values 430 may be provided to central device 302 via status connection 326, for example, or may be stored in another location (such as optional storage 324, which may be a register, buffer, or other memory location) from which the samples can subsequently be retrieved by central device 302.

Similar to FIG. 4A, FIG. 4B depicts various signals that may be generated within the above-described digital or mixed-signal system 300. Such signals may include a central device clock signal 402, a destination device clock signal 404, and a series of synchronization pulse signals 406 (pulse P1), 408 (pulse P2), 410 (pulse P3) that are, in this example, each delayed by a delay amount (e.g., 432A, 432B) relative to the central device clock signal 402. In this example, and as discussed above, the delay amounts 432A, 432B may vary based on a pulse width of the reference or central device clock (wherein the pulse width of a respective device clock is generally the same as the pulse width of a reference clock provided to a central or destination device). For example, pulse 406 (P1) may be delayed by a delay amount 432A equal to ½ the pulse width (PW) of the central or destination device clock(s), while pulse 408 may be delayed by a delay amount 432B equal to ¼ the PW of the central or destination device clock. In some examples, the synchronization pulses may be advanced or retarded by an amount based on the pulse width of the pulse width of the reference clock 306 or central device clock 402. In other examples, if a 50% duty cycle is assumed for the reference clock 306 or central device clock 402, the synchronization pulses may be advanced or retarded by based on the clock period of the central device clock 402 or reference clock 306. In such an example, a synchronization pulse may be advanced or retarded by ½ the clock period, after which the pulse may be retarded or advanced by a ¼ clock period when an edge is detected. As discussed above, this "homing in" method may detect an edge of the destination device clock in a shorter period of time or with fewer samples than when advancing or retarding the synchronization pulses P1-P4 by a predetermined delay amount, as illustrated in FIG. 4A. The synchronization pulse signals 406, 408, 410, 412 may be generated by sync pulse generator 310 and delayed by variable delay circuitry 312, for example.

In some examples, the synchronization pulse signals 406, 408, 410 are received by destination device(s) 304. As depicted in FIG. 4B, in response to detecting a rising edge 414, 416, 418 of the synchronization pulse signal 406, 408, 410 (e.g., using clock sampler circuitry 322), the destination device(s) 304 samples (e.g., using clock sampler circuitry 322) the destination device clock 404 and returns a sample value 430 to the central device (e.g., sample S1 corresponding to pulse 406 or P1, sample S2 corresponding to pulse 408 or P2, sample S3 corresponding to pulse 410 or P3, sample Sn corresponding to pulse 412 or Pn, etc.). Thus, in response to detecting a series of pulse edges 414, 416, 418, the destination device returns a series of sample values 430. The sample values 430 may be provided to central device 302 via status connection 326, for example, or may be stored in another location (such as optional storage 324, which may be a register, buffer, or other memory location) from which the samples can subsequently be retrieved by central device 302.

While the above description describes the destination device sampling the destination clock signal in response to detecting a rising edge of a synchronization pulse, a person of skill in the art would understand that the described approach could also be implemented using the falling edge (e.g. falling edges 422, 424, 426, 428) of a synchronization pulse; that is, a destination device could be configured to sample the destination device clock signal in response to detecting a falling edge rather than in response to detecting a rising edge.

In some examples, central device 104, 302 and destination device(s) 106, 304 may include multi-chip modules (MCM), single or multiple dies in a single package, a microprocessor, one or more field programmable arrays (FPGAs), one or more Application Specific Integrated Circuits (ASICs), Systems on a Chip (SOCs). Systems in a Package (SiP), and the like. In some examples, one or more of the central and destination device(s) may be provided on or electrically coupled to a card or a board (such as printed circuit boards, printed wiring boards, and the like), which may interface with other cards or boards containing one or more digital or mixed-signal chips. In some examples, central device 104, 302 includes circuitry configured to generate periodic signals, such as a phase locked loop or oscillator. In some examples, the central device 104, 302 includes variable delay elements to advance or retard the phase of a synchronization pulse signal by a delay amount.

In some examples, destination device 106, 304 may be an FPGA, ASIC, memory chip, or other type of digital or mixed-signal circuitry. It is noted, however, that unlike some synchronization algorithms applied to microprocessors, FPGAs, ASICs, memory chips, and the like, the synchronization method and system described in the present disclosure is configured to synchronize the central device 104, 302 with one or more destination device 106, 304 and the plurality of destination devices 106, 304 with other destination devices 106, 304 to create a fully synchronized digital or mixed-signal system 300. In some examples, central device 104, 302 and/or destination device(s) 106, 304 may each include circuitry for enable communications with space-based assets (e.g., satellites, spacecraft, and the like) and terrestrial or ground-based assets (e.g., high-altitude balloons, aircraft, gateways, very small aperture terminals (VSAT), and the like). In some examples, one or more of the destination devices 106, 304 include circuitry designed to generate periodic digital signals, such as a phase locked loop or oscillator.

In one specific non-limiting example, central device 104, 302 and/or destination device(s) 106, 304 may comprise one or more analog to digital converter (ADC) circuits configured to convert an radio frequency (RF) input to a digital signal, one or more digital to analog converter (DAC) circuits configured to convert a digital signal to an RF output, one or more beamforming (BF) circuits to enable selective directionality of the readout of an RF input signal and transmission of an RF output signal, one or more digital signal processor (DSP) circuits and algorithms, and routing or switching circuitry for flexibly distributing data frames and superframes among one or more destination devices 106, 304 and among one or more destination devices 106, 304 and a central device 104, 302. In such an example, the pulse-based synchronization of the present disclosure may be configured to synchronize a mesh of central and destination devices to ensure that routing and switching functionality is performed in sufficient synchrony with all other devices in the digital or mixed-signal system. In some examples, this may help ensure that beamformed signals are output by an RF output antenna array (e.g., a direct radiating array (DRA), phased array, and the like) in the correct order and at the appropriate time and phase delay to provide the desired directionality to the RF output signal. Similarly, once central and destination devices are sufficiently synchronized, RF input signals may be beamformed and provided to destination and central device processing circuitry in the appropriate order and with appropriate phase delay. In one example, the pulse-based synchronization training discussed herein may be capable of ensuring synchronization of a plurality of central and destination devices within loops (picoseconds), which may be shorter than a single clock cycle of a digital signal processor (DSP) (e.g., digital processing hardware, digital processing circuitry, and the like). Furthermore, as noted above, the pulse-based synchronization method of the present disclosure may be operable to synchronize a central device 104, 302 with destination device(s) 106, 304 as well as synchronize the destination device(s) 106, 304 with other destination device(s) 106, 304. In this way, proper routing of signal data may be done among the devices in the system 300 which enables, among other things, accurate processing of the data and beamforming of the input and output signals.

As discussed above, FIGS. 3 and 4 depict a central device 302 and one or more destination device(s) 304. Thus, in some examples, the central device 302 may generate multiple distinct synchronization pulse signals and provide an instance of the synchronization pulse signal to each destination device 304 via a separate communication connection (e.g., a serial or parallel communication signal across a cabled, backplaned, or other similar physical interface). Each destination device 304 may receive its own synchronization pulse signal, and operate as described with respect to FIGS. 3-4. For example, in response to detecting a rising edge of the synchronization pulse, each destination device 304 may sample its own clock and return a sample value to the central device 302. The central device 302 may then advance or retard the phase of the synchronization pulse for each destination device by a predetermined amount and send the phase-adjusted synchronization pulse to each destination device. In some examples, the separate instances of the synchronization pulse signal may be delayed by the same predetermined amount. In other examples, the separate instances of the synchronization pulse signal may be delayed by different predetermined amounts.

In some examples, central device 302 may include multiple instances of phase select circuitry 314 and/or variable delay circuitry 312 to generate multiple instances of a synchronization pulse signal 318 to send to different destination devices 304. Multiple instances of phase select circuitry 314 may be controlled by control circuitry 316.

Because the central device 302 is provided with a series of samples that reflect the values of each destination device clock, the central device 302 can in effect "trace" a representation of each destination device clock 307B, 307C and compare this representation to the central device clock 307A to determine a phase offset of signals received at each destination device relative signals received at (or transmitted from) the central device. It is noted that although two destination device clocks 307B, 307C are discussed and illustrated in FIG. 3, this is only for simplicity and there may be more or fewer destination device clocks corresponding to the number of destination devices 304 provided in the system 300.

In some examples, the central device 302 can calculate the phase offset between devices 302, 304 and between devices 304 by determining the elapsed time between an edge of the central device clock 307A or reference clock 306 and an edge of the destination device clock(s) 307B, 307C, using the samples 430 of the destination device clock. A pair of sequential samples [0, 1] may indicate a rising edge of the destination device clock, for example, while a pair of sequential samples [1, 0] may indicate a falling edge. In some examples, the central device may calculate the phase offset by determining the elapsed time between a falling edge of the reference clock at the central device (e.g., the central device clock) and a falling edge of the reference clock at the destination device (using the samples received from the destination device via status connection 326, for example). The central device 302 may determine the elapsed time based on timestamp or time offset values associated with the samples, for example, as discussed above. A person of skill in the art will appreciate that there are many ways of determining the phase offset of a destination device clock with respect to the central device clock based on a comparison of the samples of the destination device clock with samples of the central device clock.

Operation Mode

Once the central device has determined the phase offset between the central device clock and a destination device clock(s), the system may enter an ongoing operation mode to ensure that the devices remain synchronized. In some examples, in the operation mode, a central device generates a phase-aligned reference synchronization pulse signal for each destination device for which it has determined a phase offset, and provides this phase-aligned reference synchronization pulse signal to each destination device. The reference synchronization pulse may be periodic, or may have a non-periodic but predictable pulse sequence.

During the operation mode, the destination device 304 maintains an internally generated reference device synchronization pulse 329 of the reference synchronization pulse signal 318 and determines whether there is a phase offset between the reference device synchronization pulse 329 based on the synchronization pulse signal relative to the synchronization pulse signal 318 provided by the central device 302. Because the synchronization pulse signal 318 provided by the central device 302 is intended to be phase-aligned, there should be no phase offset. Such a phase offset may occur, however, due to changing temperature, system error, or radiation effects such as single event transients (SETs) or other radiation effects that corrupt the reference pulse signal or internal pulse signal, for example. Radiation effects are described in more detail later.

The reference device synchronization pulse 329 of the synchronization pulse 318 may be maintained by pulse generating circuitry 328, which in some examples includes circuitry configured to generate periodic signals, such as a phase locked loop or oscillator. Internal pulse generating circuitry 328 may be provided in one or more destination devices 304 in order to enable the destination device(s) 304 to determine whether the reference device synchronization pulse 329 has drifted or otherwise become out of phase with respect to the synchronization pulse 318, as will be discussed below. However, by providing an internally-generated reference device synchronization pulse 329, the destination device(s) 304 may continue to operate even if no synchronization pulse 318 is present. This may occur if the central device 302 becomes inoperable for some reason, including impact from ionizing radiation or other types of single event effects (SEE), or when there is some other disruption preventing the synchronization pulse 318 from being properly communicated to one or more of the destination devices 304. Furthermore, there may be implementations where it is desirable for the destination device(s) 304 to operate at a pulse rate which is higher than the pulse rate of the central device 302 and/or the synchronization pulse 318. For example, and without limitation, it may be desirable to allow for updating and refreshing of routing tables for routing and switching circuitry within the destination device(s) 304, central device 302, and/or the system 300. Accordingly, by providing internal pulse generating circuitry 328 in the destination device(s) 304 (and optionally in the central device 302), the system 300 may be able to advantageously update and change routing topologies much faster than if the destination device(s) 304 were operating on the synchronization pulse 318. In some examples, route tables in each destination device 304 may be updated based upon the internally generated reference device synchronization pulse 329. In some examples, by ensuring the each destination device 304 is synchronized with other destination device(s) 304 as set forth in the present disclosure, route table updates may be applied at precise times across all destination devices 304.

In some examples, destination device(s) 304 determine whether the reference device synchronization pulse 329 and the synchronization pulse signals 318 remain synchronized by monitoring (e.g., sampling) the two synchronization pulse signals continuously or nearly continuously and comparing their values. If a destination device 304 determines that there is a phase offset between the two synchronization pulse signals that is greater than a predetermined amount (i.e., the difference exceeds a threshold), the destination device(s) 304 may report a loss of synchronization condition to the central device by sending an indication of an error to the central device 302, such as an error code. In some examples, in response to receiving an indication of an error, the central device 302 re-initiates the training mode described above with respect to FIGS. 3-4 to determine a new phase offset between the central device 302 and the destination device(s) 304 that reported the error. In some examples, re-initiating the training mode causes the central device 302 to calculate a new phase offset between itself and one or more destination devices 304 using the approach described above with respect to the training mode. In some examples, a phase offset between the synchronization pulse 318 and internally-generated reference device synchronization pulse 329 may result from radiation effects on all or a portion of the destination device(s) 304, the central device 302, and/or communications lines communicatively coupling the central device 302 and destination device(s) 304. If such a phase offset is detected, the system and method of the present disclosure may initiate the training mode to re-establish synchronization between the central and destination devices.

In some examples, central device 302 includes control circuitry 316 that monitors status information received, via status connection 326 (which may also be referred to as a feedback connection 326) from each destination device 304 to determine whether to operate in a training mode or operation mode.

In the digital or mixed-signal system as presently disclosed, the phase-aligned synchronization pulse can be provided to the one or more destination devices 304 synchronously, thus eliminating potential delay or time uncertainties due to meta-stability circuits, which are needed when the relationship between the clock and synchronization pulse are unknown, and results in uncertainty in the final delay through the destination device(s) or central device circuitry that may impair the ability to align destination devices tightly. In this case, the destination devices 304 can synchronously sample the central device's 302 synchronization pulse 318. If the electrical path lengths of the synchronization signal paths are known a priori (e.g., from a circuit floorplan or layout tool), this presently-disclosed system and method will allow synchronization between all destination devices 304 to be within one destination device clock cycle. The generated pulses can be advanced or delayed as required to compensate for the delay from the central device 302 to the destination devices 304, such that all destination devices 304 receive a pulse within a clock cycle of each other.

If the electrical paths lengths of the synchronization signal are not known, then an optional return path signal (not shown) can be used from a destination device 304. In this case, the central device 302 sends out the signal to the destination device and determines how long it takes to come back. The central device 302 can use the round trip time to calculate the electrical path length between the devices. In some examples, the central device 302 may send a signal to the destination device(s) 304 and listen or monitor for a reflection of the signal from the destination device(s) 304, from which it can determine an effective electrical path length.

In some examples, because central device 302 can determine the phase offset of each destination device 304, central device 302 can also determine the phase offsets between two destination devices 304 relative to each other. Thus, once the central device has determined phase offsets to all the destination devices 304, the central device can adjust the synchronization pulses so that the destination devices receive the pulse at essentially the same time. In this way, a distributed network of devices in a system 300 may be collectively synchronized with each other.

FIG. 5 depicts an exemplary method for determining a phase offset between a central device clock and a destination device clock.

At block 502, a delay amount is obtained. In some examples, the delay amount is obtained by the central device. In some examples, the delay amount is determined by control circuitry (e.g., control circuitry 316) of the central device based on a pulse width of a reference clock, for example, in some examples, central device 302 obtains the delay amount from an external source, such as from a user-provided parameter, from another device, or from memory.

At block 504, a synchronization pulse signal is provided to a destination device. In some examples, the synchronization pulse signal includes one or more pulses, each pulse having a rising edge and a falling edge. In some examples, the synchronization pulse signal is provided to the destination device via a direct communication connection, such as a wire.

At block 506, the synchronization pulse signal is detected. In some examples, the pulse signal is detected at the destination device. In some examples, the pulse signal is detected by clock sampler circuitry that is located within the destination device or external to the destination device.

At block 508, in response to detecting the pulse signal, a sample of the destination device clock is obtained. In some examples, the sample is obtained by clock sampler circuitry. In some examples, the sample includes a sample value that is one of two values; e.g., a logical one or a logical zero. In some examples, the sample includes a timestamp value based upon the position of the sample within a register.

At block 510, the sample is provided to the central device. In some examples, the sample is provided to the central device by the destination device, or by clock sampler circuitry, for example. In some examples, the sample is provided to the central device by storing the sample in intermediate storage from which the central device can retrieve the sample. In some examples, the sample is provided to the central device via a direct communication connection, such as a wire.

At block 512, the central device determines whether enough samples have been received to enable calculation of a phase offset between the central device clock and the destination device clock. If the central device determines that it cannot calculate the phase offset, blocks 502-510 are repeated. If the central device determines that it can calculate the phase offset, block 514 is performed.

At block 514, a phase offset between the central device clock and the destination device clock is calculated based on one or more samples provided at block 510. In some examples, the phase offset is determined by determining the amount of time elapsed between an edge of the central device clock and an edge of the destination device clock. In some examples, the central device may identify an edge of the destination device clock by identifying consecutive samples with different values; e.g., if the first sample value is 0 and the second sample value is 1, or the first sample value is 1 and the second sample value is 0.

Radiation Considerations

In some cases, the above described systems and methods may be used within a payload of a satellite or other high-altitude asset, such as a commercial communication satellite or other type of satellite that requires high-speed digital and mixed-signal circuitry. Accordingly, due to the ionizing radiation environment experienced by electronics operating in space and high-altitude applications, it may be desirable for all or portions of the electronics implementing the disclosed systems and methods to be radiation hardened or radiation tolerant. This can include any or some combination of electronics that have been radiation hardened by process (having to do with the underlying semiconductor technology regarding how the electronic device is fabricated), by design (having to do with the physical layout of the circuit elements on the die) or by other means. Radiation tolerance may be determined via test, analysis, or test and analysis of devices whose design was not intentionally optimized for use in an ionizing radiation environment (e.g., commercial off the shelf (COTS) devices).

The harsh environment faced by a space-based or high-altitude asset can increase the challenge of designing electronic circuitry. One of the primary environmental risks in a satellite application is associated with the ionizing radiation environment present in space. At high altitudes, such as altitudes at or above traditional commercial airline altitudes, the ionizing radiation environment is less severe than space but radiation effects and upsets are still a major consideration for the operation of electronics. It should be noted that radiation effects associated with ionizing radiation are also present in terrestrial applications and such radiation effects are generally termed soft errors. The ionizing radiation environment in space and high-altitude environments includes heavy ions, protons, and neutrons which can impact the normal operation of semiconductor devices via single event effects (SEE), total ionizing dose (TID), and/or displacement damage dose (DDD). The effects of TID and DDD are generally cumulative over the mission duration and impact semiconductor parameters including current leakage. The effects of SEE are generally instantaneous and can impact the operation of the semiconductor circuit. These SEE effects include single event latchup (SEL), single event upset (SEU), single event transient (SET), and single event functional interrupt (SEFI). Mitigation for SEL can be provided via use of a technology such as silicon on insulator (SOI). The effects of SEU, SET, and/or SEFI can include causing a serial communication line (commonly referred to as a lane) to go into an invalid state (an example would be loss of lock) in which valid data is no longer being transmitted or received for an extended period of time. The rate of occurrence of soft errors in terrestrial applications for a typical semiconductor chip design is significantly lower than the rate of occurrence of SEU, SET, and/or SEFI for the same semiconductor chip design in space applications. For this reason, space applications demand more stringent radiation effects testing and qualifying to ensure operation for extended periods of time without significant disruption to satellite or high-altitude asset functionality.

The mitigation of SEU, SET, and/or SEFI in semiconductor chip designs for space or high-altitude applications can be performed using a variety of techniques including the selection and optimization of materials and processing techniques in the semiconductor fabrication (radiation hard by process (RHBP)), and by the design and fabrication of specialized structures in the design of the chip which is then fabricated via conventional materials and processes in the semiconductor fabrication process (radiation hard by design (RHBD)). There are additional techniques for providing system-level mitigation in systems that include semiconductor chips that are either RHBP, RHBD, or conventional (not specifically optimized for use in an ionizing radiation environment), such SEU, SET, and/or SEFI mitigation techniques are referred to as system level radiation mitigation techniques (SLRMT) or radiation hardening by implementation (RHBI). Radiation mitigation may also include compensating for detected radiation effects efficiently, and may include detection and mitigation functionality a temporally and/or spatially close to components which may be more susceptible to radiation effects, or which would cause an outsized impact on overall asset functionality if impacted by radiation. Testing and/or analysis of a circuit, component, or chip may help determine the particular electrical components which may be more susceptible, and system-level radiation mitigation may be provided targeting these susceptible components specifically for monitoring, compensation, and/or correction.

The effective design of electronics systems for use in the space ionizing radiation environment requires that the system design team make effective and efficient use of components that are either RHBP, RHBD, and/or conventional and often includes the use of RHBI. The optimization of the component selection and RHBI depends to a large extent on the specific details of the radiation effects that are to be mitigated and the desired level of system radiation tolerance to be obtained. Many SEU, SET, and/or SEFI are generally best mitigated as close as possible, both spatially and temporally, to where the SEE induced event occurred in the component or system level circuit to provide effective and efficient mitigation of such effects. For example, the duration of SET induced in ASIC technology nodes with a feature size<90 nm, can be <1 nSec., and can be as short as several tens of pSec for feature sizes<32 nm. The mitigation of such short duration SET within the same semiconductor package can provide for a more efficient implementation of SET mitigation relative to an approach which spans two of more chips in separate locations within the same system. This efficiency results from the ability to detect and mitigate spatially and/or temporally close to the source of the SEE induced errors.

Radiation test may be accomplished using a beam of charged particles from a particle accelerator where the charged particle beam may include protons and/or heavy ions and the accelerator may be a cyclotron or a linear accelerator. The beam energy in the case of a proton beam may be in the range of 0.1 MeV to over 200 MeV and is typically in the range of approximately >1 MeV to either approximately 65 or 200 MeV. The beam in the case of a heavy ion beam may have a linear energy transfer (LET) in the range of 0.1 to over 100 MeV cm2/mg and is typically in the range of >0.5 to approximately 60 to 85 MeV cm2/mg. The total fluence of particles used in such tests can vary considerably and is often in the range of 106 to over 1012 particles per cm2 at each beam energy in the case of a proton beam and is often in the range of 102 to over 108 particles per cm2 at each LET value in the case of a heavy ion beam. The number of radiation induced upsets (SEU), transients (SET), and/or functional interrupts (SEFI) is often expressed as a cross section which relates to the number of observed events in a given area (typically 1 cm2) as a function of the beam fluence. The cross section is no greater than 1.0 and can be smaller than 10-10 cm2, it is often in the range of approximately 10-2 to <10-10 cm2. A device is generally considered to be radiation tolerant if the number of detected SEU, SET, and/or SEFI is sufficiently small that it will not have a significant impact on the operation of the system or circuit containing one or more instances of that device. A heavy ion cross section<10-4 cm2 at a LET>37 MeV cm2/mg as demonstrated by test and/or analysis is an example of a cross section which may be sufficient to be demonstrate that a given device is radiation tolerant. The heavy ion or proton cross section that is measured or determined by analysis for a device at one or more beam LET values or beam energy values to be considered radiation tolerant may vary considerably and depends in part on the anticipated orbit for the satellite and the extent to which the circuit and/or system containing that device is capable of maintaining the desired operation when a SEU, SET, and/or SEFI occurs.

All electrical components set forth in the present disclosure may include at least some type of radiation hardening, radiation tolerance, and/or radiation compensation. Accordingly, the ADCs. DACs, SerDes, central devices, destination devices, FPGAs. ASICs, pulse generators, clock samplers, storage, variable delay circuitry, communication lines, inputs, outputs, channelizers, reconstructors, digital signal processors (DSPs), beamformers, may be in some examples radiation-tolerant ADCs, radiation-tolerant DACs, radiation-tolerant central devices, radiation-tolerant destination devices, radiation-tolerant FPGAs, radiation-tolerant ASICs, radiation-tolerant pulse generators, radiation-tolerant clock samplers, radiation-tolerant storage, radiation-tolerant variable delay circuitry, radiation-tolerant communication lines, radiation-tolerant inputs, radiation-tolerant outputs, radiation-tolerant channelizers, radiation-tolerant reconstructors, radiation-tolerant digital signal processors (DSPs), and/or radiation-tolerant beamformers. In some examples, partial or complete triple modular redundancy (TMR) may be provided at the potential expense of additional die space or power consumption. In other examples, the use of library cells having physical designs optimized to reduce the probability of SEEs may be used. As discussed above, by providing and integrating these elements in a single package, such as a single monolithic device, single die, multiple dies, or a hybrid device in a single package, the detection of radiation induced effects may be quickly detected and corrected or compensated for with low-latency as compared with these circuit elements and processors being provided outside of the package, such as at a different location on the board or card. This is at least partially due to the fact that if the ADC, DAC, reconstructor, channelizer, DSP cores, and/or beamformers are located off-package or outside of an integrated package, radiation-effected signals and radiation correction signals must be passed through physical interfaces such as board or card connectors, solder connections, pins, and the like. This introduces significant delay and may degrade the signal to an extent that radiation effects may not be properly corrected or compensated for. In some examples, the ADCs, DACs, SerDes and other serial communications lanes, channelizers, reconstructors, beamformers, central devices, destination devices, FPGAs, ASICs, pulse generators, clock samplers, storage, variable delay circuitry, communication lines, and other electrical components integrated into the single package as disclosed herein may have radiation effects such as SEES, SEUs, SETs, SEFIs, and the like compensated by use of radiation compensation algorithms provided elsewhere on the chip, package, card, and/or board. This may in some examples include scrubbing algorithms and processes and off-package radiation effects detection and radiation compensation triggering.

Although the technology has been described in language that is specific to certain structures, materials, and methodological steps, it is to be understood that the invention defined in the appended claims is not necessarily limited to the specific structures, materials, and/or steps described. Rather, the specific aspects and steps are described as forms of implementing the claimed invention. Since many embodiments of the invention can be practiced without departing from the spirit and scope of the invention, the invention resides in the claims hereinafter appended. Unless otherwise indicated, all numbers or expressions, such as those expressing dimensions, physical characteristics, etc. used in the specification (other than the claims) are understood as modified in all instances by the term "approximately." At the very least, and not as an attempt to limit the application of the doctrine of equivalents to the claims, each numerical parameter recited in the specification or claims which is modified by the term "approximately" should at least be construed in light of the number of recited significant digits and by applying ordinary rounding techniques. Moreover, all ranges disclosed herein are to be understood to encompass and provide support for claims that recite any and all subranges or any and all individual values subsumed therein. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

What is claimed is:

1. A method of synchronizing clock signals in a system implemented in a space-based or high-altitude asset, the system comprising a central device having a central device clock and a destination device having a destination device clock, the method comprising:

(a) obtaining a first delay amount;
(b) providing, by the central device, a pulse signal to the destination device, wherein the pulse signal is advanced or retarded by the delay amount;
(c) detecting, at the destination device, the pulse signal;
(d) in response to detecting the pulse signal, obtaining, at the destination device, a sample of the destination device clock and storing the sample in a register;
(e) providing the sample of the destination device clock to the central device;
(f) determining, by the central device, whether enough samples are stored in the register to enable calculation of a phase offset between the central device clock and the destination device clock, wherein the phase offset may be calculated when an edge of the destination device clock is detected based on the samples;
(g) in accordance with a determination that a phase offset cannot be calculated, adjusting the first delay amount and repeating steps (a)-(f); and
(h) in accordance with a determination that the phase offset can be calculated, then calculating, by the central device, the phase offset based on a position, in the register, of the sample representing the edge of the destination device clock.

\* \* \* \* \*

UNITED STATES PATENT AND TRADEMARK OFFICE
CERTIFICATE OF CORRECTION

PATENT NO. : 10,461,753 B1
APPLICATION NO. : 15/978017
DATED : October 29, 2019
INVENTOR(S) : Jeff Pritchard et al.

It is certified that error appears in the above-identified patent and that said Letters Patent is hereby corrected as shown below:

In the Specification

In Column 7, Line 35, delete "P¬n" and insert -- Pn --, therefor.

In Column 10, Line 21, delete "(SOCs)." and insert -- (SOCs), --, therefor.

In Column 11, Line 16, delete "loops" and insert -- 100 ps --, therefor.

In Column 14, Line 46, delete "clock, for" and insert -- clock. For --, therefor.

In Column 17, Line 47, delete "ADCs." and insert -- ADCs, --, therefor.

In Column 17, Line 48, delete "FPGAs." and insert -- FPGAs, --, therefor.

In Column 18, Line 23, delete "SEES" and insert -- SEEs --, therefor.

In the Claims

In Column 19, Line 25, Claims 2-20 should read as follows:
-- 2. The method according to claim 1, wherein the phase offset is calculated based on at least two samples of the destination device clock stored in the register.
3. The method according to claim 2, wherein enough samples have been received in step (f) when the at least two samples comprise a first sample value of logical value 0 or 1, and a second sample value is the other of the logical value 0 and 1, wherein the second sample is stored in the register sequentially after the first sample.
4. The method according to claim 3, wherein a first pulse of the pulse signal with a first delay amount causes the first sample to be stored in a first position in the register by the destination device and a second pulse with a second delay amount of the pulse signal causes the second sample to be stored in a second position in the register by the destination device, and wherein a phase offset is calculated based on the second delay amount.

Signed and Sealed this
First Day of March, 2022

Drew Hirshfeld
*Performing the Functions and Duties of the*
*Under Secretary of Commerce for Intellectual Property and*
*Director of the United States Patent and Trademark Office*

5. The method according to claim 1, further comprising:

(i) based on the calculated phase offset, providing, by the central device, a phase-aligned reference pulse signal to the destination device;

(j) generating, by the destination device, an internal pulse signal;

(k) determining, at the destination device, whether the internal pulse signal is phase aligned with the reference pulse signal;

in accordance with a determination that the reference pulse signal and internal pulse signal are phase aligned, repeating steps (i)-(k); and in accordance with a determination that the reference pulse signal and internal pulse signal are not phase aligned, providing an indication of an error to the central device.

6. The method according to claim 5, further comprising:

receiving, at the central device, the indication of the error;

in response to receiving the indication of the error, repeating steps (a) – (g) to calculate a new phase offset of the destination device clock relative to the central device clock.

7. The method according to claim 1, wherein the destination device is a first destination device having a first destination device clock, the system further comprising a second destination device having a second destination device clock, the method further comprising:

(l) obtaining a second delay amount;

(m) providing, by the central device, a second pulse signal to the second destination device, wherein the second pulse signal is advanced or retarded by the second delay amount;

(n) detecting, at the second destination device, the second pulse signal;

(o) in response to detecting the second pulse, obtaining, at the second destination device, a sample of the second destination device clock and storing the sample in a second register;

(p) providing the sample of the second destination device clock to the central device;

(q) determining, by the central device, whether enough samples are stored in the register to enable calculation of a second phase offset between the central device clock and the second destination device clock, wherein the second phase offset may be calculated when an edge of the second destination device clock is detected based on the samples;

(r) in accordance with a determination that the second phase offset cannot be calculated, repeating steps (l) –(q);

(s) in accordance with a determination that the second phase offset can be calculated, then calculating, by the central device, the second phase offset based on the position, in the register, of the sample representing the edge of the second destination device clock.

8. The method according to claim 7, wherein enough samples have been received in step (q) when the at least two samples comprise a first sample value of logical 0 or 1, and a second sample value is the other of the logical 0 and 1, wherein the second sample is stored in the register sequentially after the first sample.

9. A system for synchronizing digital devices, comprising:

a central device comprising:

a first input port configured to receive a reference clock signal;

a synchronization pulse generator configured to receive a central device clock and generate a synchronization pulse signal, wherein the central device clock is the reference clock signal as received at the central device;

control circuitry configured to obtain a delay amount;

variable delay circuitry configured to receive the delay amount and delay the synchronization pulse signal by the delay amount;

a destination device comprising:
a second input port configured to receive the reference clock signal;
a clock sampler circuit configured to:
receive the synchronization pulse signal and a destination device clock, wherein the destination device clock is the reference clock signal as received at the destination device;
detect a pulse in the synchronization pulse signal;
in response to detecting the pulse, obtain a sample of the destination device clock and store the sample in a register;
provide the sample of the destination device clock to the central device;
wherein the central device is configured to determine if enough samples are stored in the register to enable calculation of a phase offset between the central device clock and the destination device clock, wherein the phase offset may be calculated when an edge of the destination device clock is detected based on at least two samples; and
wherein the central device is further configured to calculate a phase offset between the central device clock and the destination device clock based on the at least two samples of the destination device clock, the phase offset calculated based on a position of the two samples in the register.

10. A mixed-signal system implemented in a space-based or high-altitude asset, the system comprising:
a central device comprising:
a first reference clock signal input for receiving a central device clock based on a reference clock signal;
a synchronization pulse generator configured to generate a synchronization pulse;
a variable delay device configured to advance or delay the synchronization pulse by a delay amount;
one or more destination devices, each comprising:
a second reference clock signal input for receiving a destination device clock based on the reference clock signal;
a synchronization pulse input;
a clock sampler configured to receive the destination device clock and the synchronization pulse;
wherein each time the one or more destination devices receive the synchronization pulse, the clock sampler is configured to sequentially store a sample to a register, the sequentially-stored samples including a logical value based on the destination device clock; and
wherein when the sequentially-stored samples comprise a first sample and a second sample, the first sample different from the second sample, the central device determines if there is a phase offset between the one or more destination device clocks relative to the central device clock and sets a delay amount for advancing or delaying, using a variable delay circuit, the synchronization pulse by the delay amount.

11. The mixed-signal system according to claim 10, wherein the one or more destination devices comprise an internal pulse generator configured to generate a reference device synchronization pulse based on the synchronization pulse and when the central device determines the phase offset between the one or more destination device clocks and the central device clock is below a predetermined threshold or is zero.

12. The mixed-signal system according to claim 11,
wherein the one or more destination devices further comprise a status connection configured to communicatively couple the one or more destination devices and the central device; and wherein the one or more destination devices are configured to transmit an error code, via the status connection, in response to a determination, by the clock sampler, that there is a phase offset between the reference device synchronization pulse and the synchronization pulse and/or there is no synchronization pulse received at the synchronization pulse input.

13. The mixed-signal system according to claim 12, wherein the error code is transmitted to the central device in response to the phase offset between the reference device synchronization pulse and the synchronization pulse being greater than a predetermined amount.

14. The mixed-signal system according to claim 10, wherein each of the one or more destination devices further comprise at least one analog to digital converter (ADC) circuits configured to convert a radio frequency (RF) input to a digital signal and/or one or more digital to analog converter (DAC) circuits configured to convert a digital signal to an RF output.

15. The mixed-signal system according to claim 10, wherein the one or more destination devices further comprise a status connection configured to communicatively couple the one or more destination devices and the central device.

16. The mixed-signal system according to claim 10, wherein the one or more destination devices comprise the clock sampler.

17. The mixed-signal system according to claim 10, wherein the clock sampler is provided at a second reference clock signal input external to the one or more destination devices.

18. The mixed-signal system according to claim 10, wherein the delay amount is varied, by a variable delay device, by a predetermined amount between each sequential sample having the same logical value.

19. The mixed-signal system according to claim 18, wherein the predetermined amount is based upon the pulse width or clock period of the reference clock signal.

20. The mixed-signal system according to claim 10, wherein when the phase offset between the one or more destination device clocks relative to the central device clock is below a predetermined threshold or is zero, the delay amount is set to zero. --, therefor.